(12) United States Patent
Ivry (10) Patent No.: US 7,304,543 B2
(45) Date of Patent: Dec. 4, 2007

(54) BURST-MODE TIA (TRANS-IMPEDANCE AMPLIFIER)

(75) Inventor: Raanan Ivry, Haifa (IL)

(73) Assignee: PMC-Sierra Israel Ltd., Herzliya Pituach (IL)

( * ) Notice: Subject to any disclaimer, the term of this patent is extended or adjusted under 35 U.S.C. 154(b) by 106 days.

(21) Appl. No.: 11/318,475

(22) Filed: Dec. 28, 2005

(65) Prior Publication Data

US 2007/0146080 A1 Jun. 28, 2007

(51) Int. Cl.
*H03F 3/08* (2006.01)
(52) U.S. Cl. ...................................... 330/308; 330/282
(58) Field of Classification Search ................ 330/308, 330/279, 298, 282, 291
See application file for complete search history.

(56) References Cited

U.S. PATENT DOCUMENTS

| | | | | |
|---|---|---|---|---|
| 5,179,353 | A | * | 1/1993 | Miyake ....................... 330/129 |
| 5,640,691 | A | * | 6/1997 | Davis et al. ................. 455/126 |
| 5,732,334 | A | * | 3/1998 | Miyake ....................... 455/126 |
| 5,952,883 | A | * | 9/1999 | Masuta ....................... 330/279 |

OTHER PUBLICATIONS

Maeda et al., *IEEE Communications Magazine*, vol. 40, p. 126-132, Dec. 2001 "FASN OAN-WG and Future Issues For Broadband Optical Access Networks".

Yamashita et al., *IEEE J. Solid-State Circuits*, vol. 37, p. 881-886, Jul. 2002; "Novel cell-AGC Technique for Burst-Mode CMOS Preamplifier With Wide Dynamic Range And High Sensitivity For ATM-PON System".

Le et al., *ISSCC Dig. Tech. Papers*, p. 474-475, Feb. 2004 "Burst Mode receiver for 1.25Gb/s Ethernet PON with AGC and Internally Created Reset Signal".

Ota et al, *IEEE J. Lightwave Technol.*, vol. 12, No. 2, p. 325-331, Feb. 1994 "High speed, Burst Mode Packet-Capable Optical Receiver And Instantaneous Clock Recovery For Optical Bus Operation".

Nakamura et al., *IEEE J. Solid-State Circuits*, vol. 33, p. 1179-1187, Aug. 1998; "A 156-Mb/s CMOS Optical Receiver for Burst-Mode Transmission".

Brigati et al., *IEEE J. Solid-State Circuits*, vol. 37, p. 887-894, Jul. 2002 "A SiGe BiCMOS Burst-Mode 155-Mb/s Receiver for PON".

\* cited by examiner

*Primary Examiner*—Henry Choe
(74) *Attorney, Agent, or Firm*—Mark M. Friedman (57) ABSTRACT

Devices and methods for processing signals using a Burst-Mode TIA that meets EPON and GPON specifications are disclosed herein. A signal provided by a power detector is processed with the appropriate gain by using a gain selector which includes a feedback circuit to choose the gain internally, thereby eliminating the need for an external control. Further embodiments of the invention include power detectors featuring a low-pass filter, a peak detector, and/or an envelope detector. Further embodiments of the invention include a Freeze function circuit for maintaining a current gain. Further embodiments of the invention apply appropriate gains when bursts with substantially different power levels are received consecutively, and prevent the gain from being changed during a burst. In this method, a two-pole low-pass filter with an undamped response function is used.

30 Claims, 5 Drawing Sheets

40 LPF = Low-Pass Filter
42 ED = Envelope Detector
44 PD = Peak Detector

BURST-MODE TIA (TRANS-IMPEDANCE AMPLIFIER)

FIELD AND BACKGROUND OF THE INVENTION

The present invention relates to Burst-Mode Trans-Impedance Amplifiers, which can have controlled- or uncontrolled-gain, for point-to-multipoint communication and fast optical switching applications.

Fiber-optic communication systems require an amplifier at the receiver to amplify the weak currents generated by the detector diode. These amplifiers must provide sufficient bandwidth, sensitivity, dynamic range, and output signal level to achieve good system performance. The most common amplifier in the fiber-optic field is known as a Trans-Impedance Amplifier (TIA). It is part of almost every optical transceiver. It consists of a high-gain amplifier and a feedback resistor.

Some new fiber-optic communication technologies, like point-to-multipoint links and switches, require fast signal "lock-in", in addition to the common requirements of a TIA. In this case, the off-the-shelf components cannot meet the requirements. The reason for this is that it takes a relatively long period of time for a TIA to output a stable signal.

The majority of applications for a Burst-Mode TIA are in FTTH (Fiber-to-the-Home) networks in which a point-to-multipoint topology is used. For this application, we define burst mode to mean a transmission mode where data is transmitted in bursts rather than in continuous streams. In addition, fast optical switching applications require a Burst-Mode TIA in order to quickly output a reliable signal after switching has occurred.

A Burst-Mode optical receiver (or TIA) with fast response is required for Passive Optical Networks (PON) [see e.g. IEEE 802.3ah Draft Standard, p. 358, ITU-T Recommendation G.984.2 p. 27, and Maeda et al., *IEEE Communications Magazine*, vol. 40, p. 126-132, December 2001]. In PON systems, an optical line terminal (OLT) receives a burst of packet data with different optical powers due to point-to-multipoint communication. The receiver in the OLT must handle this type of packet data. The receiver requires high sensitivity, wide dynamic range, and quick response. Low cost and high reliability are also required in such PON networks.

Supporting the wide dynamic range is achieved by several existing methods. One of these methods utilizes high-speed Automatic Gain Control (AGC) [Yamashita et al., IEEE J. Solid-State Circuits, vol. 37, p. 881-886, July 2002; Le et al., ISSCC Dig. Tech. Papers, p. 474-475, February 2004]. The drawback of AGC is that it requires long acquisition time (hundreds of bits), making it unsuitable for applications that require fast acquisition.

Another approach utilizes DC cancellation from the input signal [Ota et al., *IEEE J Lightwave Technol.*, Vol. 12, No. 2, p. 325-331, February 1994]. This may improve the dynamic range by a nominal amount (~3 dB), but it also degrades the sensitivity of the receiver (1-3 dB degradation).

Another approach utilizes nonlinear gain [Nakamura et al., *IEEE J Solid-State Circuits*, vol. 33, p. 1179-1187, August 1998; Brigati et al., *IEEE J. Solid-State Circuits*, vol. 37, p. 887-894, July 2002]. This approach is hard to implement with silicon circuit fabrication technology, and degrades the sensitivity performance as well (1-2 dB degradation).

A further method utilizes programmable gain [Nakamura et al., *ISSCC* 2005, *Optical Communication*, Session 12.4]. This method involves selecting two or more gain values based on the input value. This method seems to be the best choice for the above-mentioned applications. It does not degrade the sensitivity performance and widens the dynamic range by a factor of approximately two (in dB) in the case of selecting between two gains. It is also fast (on the order of ten bits) and easy to implement.

There is thus a widely recognized need for, and it would be highly advantageous to have, a TIA that would have a wide dynamic range without sacrificing sensitivity performance, signal integrity, or response time. Furthermore, the need to provide these features and operate in burst-mode to accommodate multi-source packet data is finding an increasing number of industrial applications.

The present invention shows two different new architectures, using a programmable gain, that enable fast selection of the appropriate gain and keep the gain constant during a burst of data.

SUMMARY OF THE INVENTION

It is the purpose of the present invention to provide a device (i.e. internal circuitry components and interface) for producing a Burst-Mode TIA with a programmable gain. The wide dynamic range of the present invention is achieved by using the programmable gain.

According to one aspect of the present invention, there is provided a device which can be used for applications in Ethernet Passive Optical Networks (EPON). This aspect provides a relaxed acquisition time because of the line-coding (like "8b10b"). "8b10b" line-coding, for example, is a coding scheme which translates 8-bit data into 10-bit data and prevents long sequences of 1's and 0's; therefore, no external control is used. We will refer to this as an uncontrolled-gain architecture.

According to another aspect of the present invention, there is provided a device which can be used for applications in Giga-Bit Passive Optical Networks (GPON). This aspect requires fast acquisition and no data line-coding like "8b10b" is used. There is a necessity to support a large number of consecutive identical digits. These are large sequences, usually up to 72 bits of 1's or 0's, which make tracking difficult; therefore, external control is used. We will refer to this as a controlled-gain architecture.

To contrast the present invention with the prior art of Nakamura, the prior art assumes apriori knowledge of the time that each burst starts. It assumes an "external reset" signal which resets the TIA before or in the beginning of a burst. There are two drawbacks to this approach: First, in some applications, an "external reset" adds an external control pin. The addition of such a pin makes the solution expensive and inappropriate for crosstalk and noise reasons. Second, the "external reset" brings the TIA to a "known state"; therefore, the entire gain selection process is done automatically within the TIA. Thus, external control of the gain selection is not possible. This makes the design very sensitive to process changes, and consequently, not robust.

The present invention provides solutions to each of the above-mentioned drawbacks. In applications where the timing requirements are relaxed (e.g. EPON or others), an uncontrolled-gain architecture is suggested. When more strict timing is required, the present invention implements a different approach. In this case, an external Freeze signal is used. This Freeze signal can put the TIA in one of two states: (1) Not Freeze—in this state, the TIA continually adapts the gain to the input signal level, (2) Freeze—in this state, the TIA keeps its last selection (i.e. before it was switched to the Freeze state). The method of the present invention enables external control of the TIA while making the TIA more robust than the prior art of Nakamura.

Therefore, according to the present invention, it is now disclosed for the first time a TIA for processing signals which includes: (a) a TIA core for providing an appropriate gain to a detector output signal, (b) a coupler for transferring a part of a TIA output signal without introducing distortion or noise, (c) a power detector for obtaining a desired signal level from the signal part provided by the coupler, (d) a feedback circuit which regulates a gain selector for choosing the appropriate gain internally based on the desired signal level from the power detector, and (e) a gain control for setting the appropriate gain obtained from the gain selector.

According to further features in preferred embodiments of the invention described below, the power detector includes a low-pass filter for filtering the signal part provided by the coupler.

According to further features in preferred embodiments of the invention described below, the power detector includes a peak detector for detecting and measuring a peak of the signal part provided by the coupler.

According to further features in preferred embodiments of the invention described below, the power detector includes an envelope detector for detecting and measuring an envelope of the signal part provided by the coupler.

According to further features in preferred embodiments of the invention described below, the gain selector includes a multiplexer for selecting an input signal based on the desired signal level from the power detector.

According to further features in preferred embodiments of the invention described below, the gain selector includes a logic unit for selecting a gain, by the feedback circuit, for both the TIA core and the input signal of the multiplexer.

According to further features in preferred embodiments of the invention described below, the TIA core includes a high-gain amplifier and feedback resistors for setting the appropriate gain.

According to further features in preferred embodiments of the invention described below, the TIA core further includes switches for engaging or disengaging the feedback resistors.

According to further features in preferred embodiments of the invention described below, the TIA operates in a burst mode.

According to further features in preferred embodiments of the invention described below, the TIA further includes a freeze function circuit for controlling the gain selector.

According to further features in preferred embodiments of the invention described below, the freeze function circuit can maintain the current gain of the gain selector.

According to further features in preferred embodiments of the invention described below, the freeze function circuit includes an interface for remotely activating or deactivating the freeze function circuit.

According to further features in preferred embodiments of the invention described below, the freeze function can override the logic unit.

According to the present invention, it is now disclosed for the first time a TIA for processing signals which includes: (a) a TIA core for providing an appropriate gain to a detector output signal, (b) a coupler for transferring a part of a TIA output signal without introducing distortion or noise, (c) a power detector for obtaining a desired signal level from the signal part provided by the coupler, (d) a feedback circuit which regulates a gain selector for choosing the appropriate gain internally based on the desired signal level from the power detector, (e) a gain control for setting the appropriate gain obtained from the gain selector, and (f) a freeze function circuit for controlling the gain selector.

According to the present invention, it is now disclosed for the first time a method for processing a signal using a TIA which includes: (a) obtaining a pre-processed signal from a power detector at the input of the TIA, (b) using a gain selector of the TIA to choose an appropriate nominal gain ($Gain_i$), (c) setting a nominal input gain ($G_i$) to the multiplexer of the TIA, and (d) controlling values of each $Gain_i$ and $G_i$ through a mathematical relation of $Gain_i$ to $G_i$, thereby providing a desired processing of the signal.

According to further features in preferred embodiments of the invention described below, the step of controlling values of each $Gain_i$ and $G_i$ through a mathematical relation of $Gain_i$ to $G_i$ includes prescribing the product of $Gain_i$ and $G_i$ to equal a constant.

According to further features in preferred embodiments of the invention described below, the step of controlling values of each $Gain_i$ and $G_i$ through a mathematical relation of $Gain_i$ to $G_i$ includes prescribing the product of $Gain_i$ and $G_i$ to equal an i-dependent nominal constant.

According to further features in preferred embodiments of the invention described below, the method is performable by the TIA operating in a burst mode.

According to the present invention, it is now disclosed for the first time a method for processing signals using a TIA which includes: (a) providing a consecutive pair of burst signals from a detector output, where the consecutive signals having substantially different power levels, (b) filtering each burst signal with a response function to provide an output signal with an appropriate gain amplification, and (c) using the output signal to obtain an accurate signal peak for each burst signal, thereby providing a desired processing of the burst signals.

According to further features in preferred embodiments of the invention described below, the step of filtering each burst signal with a response function includes filtering each burst signal with an undamped response function.

According to further features in preferred embodiments of the invention described below, the step of filtering each burst signal with a response function includes filtering each burst signal using a two-pole low-pass filter with the following response function:

$$H(s) = \frac{as+b}{\xi^2 + 2\xi\omega_n s + s^2},$$

where $\xi$ is the damping factor, $\omega_n$ is the natural frequency, a and b are constants, s is an arbitrary complex variable, and H(s) is the Laplace transform of the response of the detector, which is defined as follows:

$$H(s) = \int_0^\infty e^{-st} h(t) dt,$$

where h(t) is the impulse response of the filter.

These and further embodiments will be apparent from the detailed description and examples that follow.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a device for Burst-Mode signal processing. The principles and operation of a Burst-Mode TIA with programmable gain (both a controlled-gain and uncontrolled-gain TIA) according to the present invention may be better understood with reference to the drawings and the accompanying description.

Figure 1:
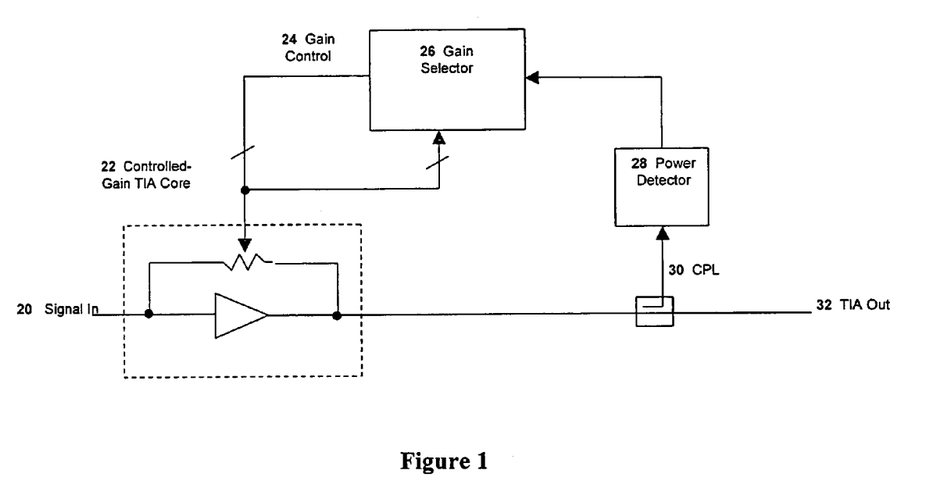
FIG. 1 shows a schematic block diagram of an electrical circuit used in an uncontrolled-gain, Burst-Mode TIA.

Referring now to the drawings, FIG. 1 is a schematic block diagram of an electrical circuit used in an uncontrolled, Burst-Mode TIA. Signal comes in from a photodiode at a Signal In 20 to a controlled-gain TIA core 22. Controlled-gain TIA core 22 provides the appropriate gain for the signal based on a gain control 24 which is chosen by a gain selector 26. Gain selector 26 obtains the output of a power detector 28 to determine which gain to select. Power detector 28 receives the signal from a coupler (CPL 30) which transfers part of the signal with minimal distortion to the output signal which is obtained at an output, TIA Out 32.

Figure 2:
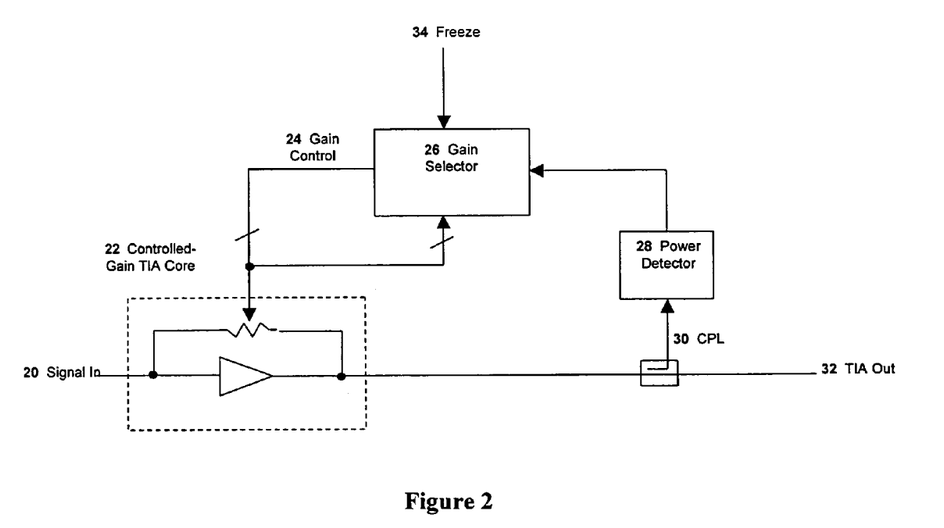
FIG. 2 shows a schematic block diagram of an electrical circuit used in a controlled-gain, Burst-Mode TIA.

FIG. 2 is a schematic block diagram of an electrical circuit used in a controlled-gain, Burst-Mode TIA. A signal comes in from a photodiode (Signal In 20) to controlled-gain TIA core 22. Controlled-gain TIA core 22 provides the appropriate gain for the signal based on gain control 24 which is chosen by gain selector 26. Gain selector 26 obtains the output of power detector 28 to determine which gain to select. Gain selector 26 can be controlled as well by a Freeze 34 function. Power detector 28 receives the signal from a coupler (CPL 30) which transfers part of the signal with minimal distortion to the output signal which is obtained at output, TIA Out 32.

Figure 3:
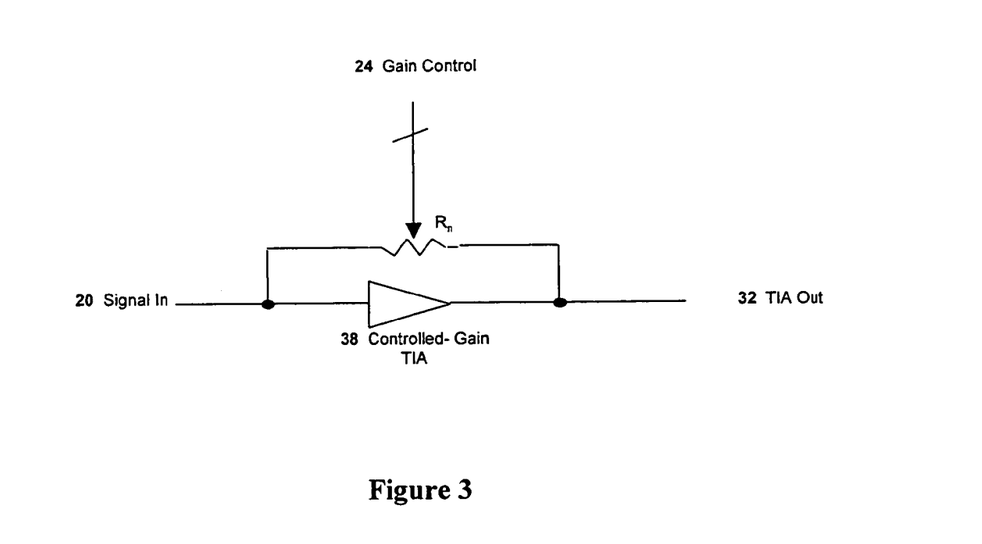
FIG. 3 shows a schematic block diagram of an electrical circuit showing a high-level description of the controlled-gain TIA core.

FIG. 3 is a schematic block diagram of an electrical circuit showing a high-level description of controlled-gain TIA core 22. The circuit comprises a high-gain amplifier 38 and a feedback resistor, $R_n$, where gain control 24 is provided. Gain control 24 is controlled by selecting different resistances.

Figure 4:
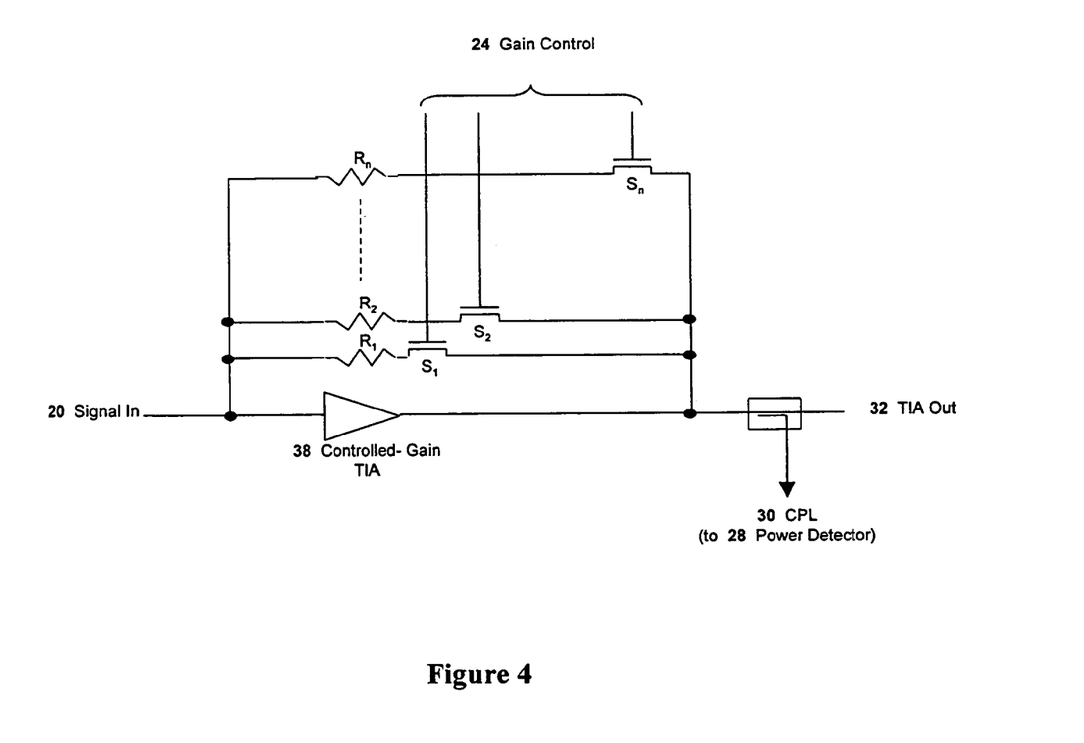
FIG. 4 shows a schematic block diagram of an electrical circuit showing a controlled-gain TIA core in which the different resistances are achieved by the opening or closing of various switches.

One preferred detailed implementation of the circuit in FIG. 3 is shown in FIG. 4. FIG. 4 shows a schematic block diagram of an electrical circuit showing controlled-gain TIA core 22 in which different resistances ($R_1$ through $R_n$) are achieved by the opening or closing of various switches ($S_1$ through $S_n$). Based on the signal to gain control 24, the gain of controlled-gain TIA core 22 is one of n gains, $Gain_1$ to $Gain_n$.

Figure 5A:
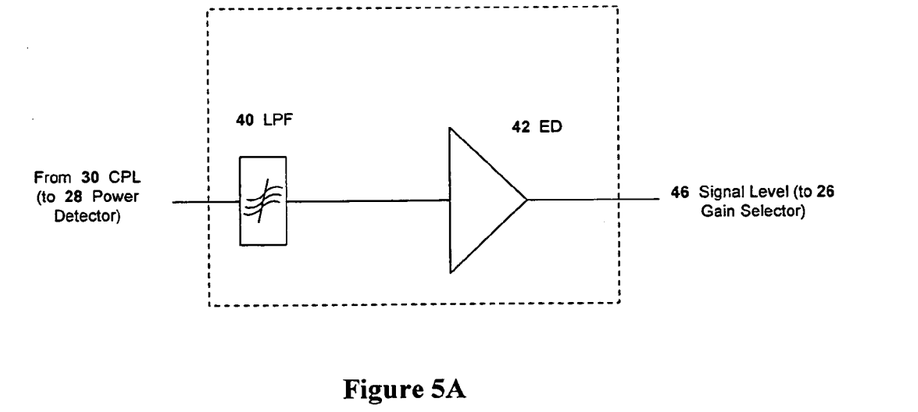
FIG. 5A shows a schematic block diagram of an electrical circuit showing a high-level description of a power detector including an envelope detector.

Embodiments of the present invention with different configurations of power detector 28 are possible. FIG. 5A shows a schematic block diagram of an electrical circuit showing a high-level description of power detector 28 including an envelope detector (ED 42). In this embodiment, power detector 28 comprises two components, a low-pass filter (LPF 40) and ED 42. Power detector 28 samples the output of controlled-gain TIA core 22 (via CPL 30), and passes its processed, output signal level 46 to gain selector 26, which selects the gain according to the level sent from power detector 28 (i.e. signal level 46).

Figure 5B:
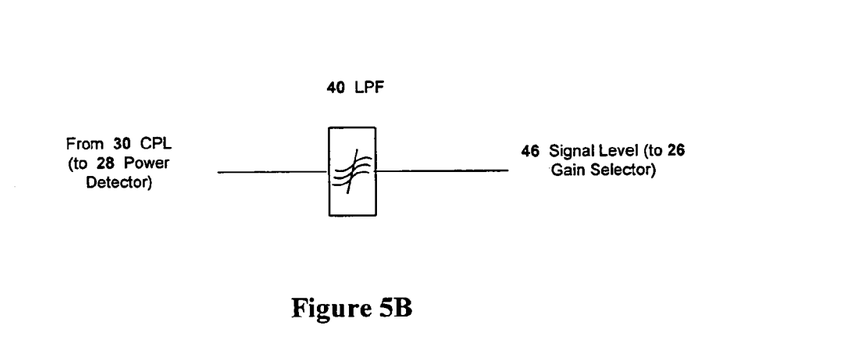
FIG. 5B shows a schematic block diagram of an electrical circuit showing a high-level description of a power detector including low-pass filter.

FIG. 5B shows a schematic block diagram of an electrical circuit showing a high-level description of power detector 28 including a low-pass filter (LPF 40). In this embodiment, power detector 28 comprises only LPF 40. The signal is routed in the same way as in FIG. 5A.

Figure 5C:
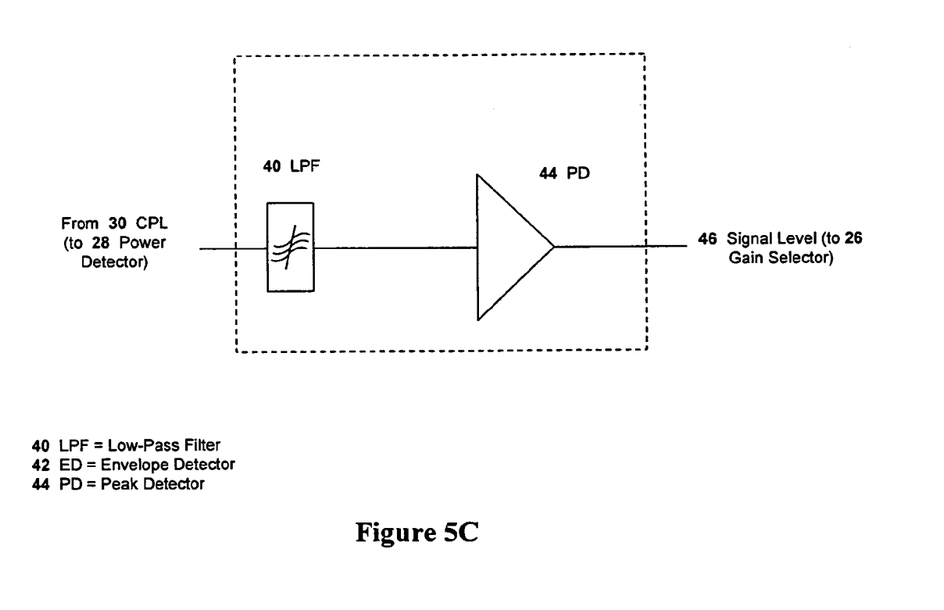
FIG. 5C shows a schematic block diagram of an electrical circuit showing a high-level description of a power detector including a peak detector.

FIG. 5C shows a schematic block diagram of an electrical circuit showing a high-level description of power detector 28 including a peak detector (PD 44). In this embodiment, power detector 28 comprises two components, LPF 40 and PD 44. The signal is routed in the same way as in FIGS. 5A and 5B.

The combination of LPF 40 and PD 44 in power detector 28 (depicted in FIG. 5C) can be used for the controlled-gain Burst-Mode TIA embodiment of the present invention (as in FIG. 1). However, for an uncontrolled-gain, Burst-Mode TIA embodiment of the present invention (as in FIG. 2), there is an additional requirement of hysteresis. This requirement is necessary to keep the gain constant during the signal burst. It also ensures that small fluctuations, like noise and other degradations, will not change the gain. This will be explained in more detail below.

Figure 6:
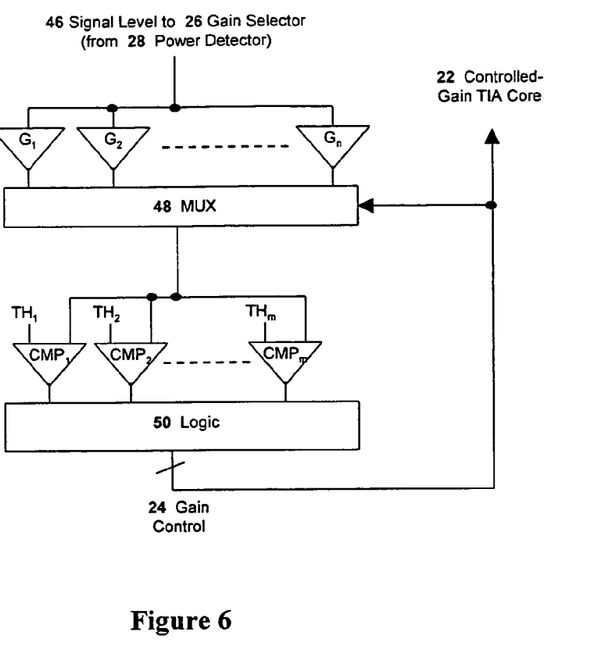
FIG. 6 shows a schematic block diagram of an electrical circuit showing a gain selector in uncontrolled-gain mode.

FIG. 6 shows a schematic block diagram of an electrical circuit showing gain selector 26 in uncontrolled-gain mode. The output of a logic unit 50 is used to select both the gain of controlled-gain TIA core 22 (one of n nominal gains, $Gain_i$) and the gain at the input of a multiplexer MUX 48, which selects one of the inputs ($G_i$) according to the input control signal. Thus, we have a feedback loop from logic unit 50 back to MUX 48 which allows gain selector 26 to choose an appropriate gain internally without the necessity of an external control.

Figure 7:
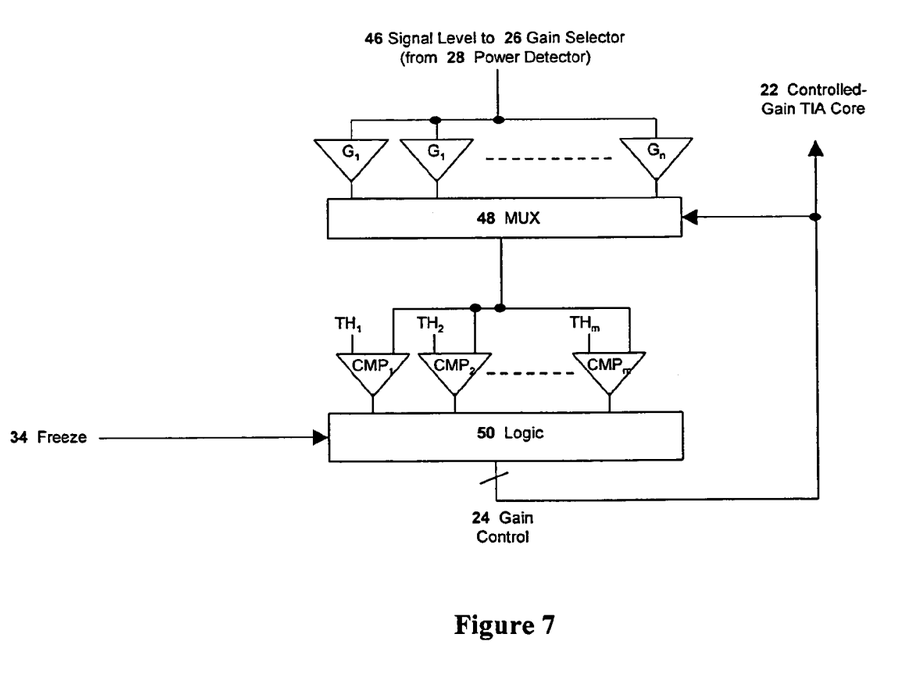
FIG. 7 shows a schematic block diagram of an electrical circuit showing a gain selector in controlled-gain mode.

FIG. 7 shows a schematic block diagram of an electrical circuit showing a gain selector 26 in controlled-gain mode. This circuit functions identically to the one shown in FIG. 6 except for the control functions. Freeze signal 34 (when activated) keeps the current gain of controlled-gain TIA core 22 ($Gain_i$) and the selected gain ($G_i$) regardless of what the input to gain selector 26 is.

There are two alternatives to set the values of the gain pair ($Gain_i$, $G_i$) in both uncontrolled-gain mode (FIG. 6) and controlled-gain mode (FIG. 7). One option is where the gain product, $Gain_i \cdot G_i$, equals a constant, which is independent of i (where i is the index of the gain from one to n). The second option is where the gain product, $Gain_i \cdot G_i$, equals a $\Delta_i$ (where $\Delta_i$ is an i-dependent nominal constant, i.e. a nominal constant for each i index).

In the embodiment of the present invention where the gain product ($Gain_i \cdot G_i$) equals a constant, hysteresis can be achieved by choosing two thresholds, $TH_1$ and $TH_2$ (i.e. m=2 in FIGS. 6 and 7). A higher threshold is set for low signals (which means high $Gain_i$), and a lower threshold is set for high signals (which means low $Gain_i$). Comparators ($CMP_1$ and $CMP_2$) provide the input to logic unit 50 based on the output of MUX 48 and the thresholds ($TH_1$ and $TH_2$).

In the embodiment of the present invention where the gain product ($Gain_i \cdot G_i$) equals $\Delta_i$, when only two amplifiers are in use (i.e. $G_1$ and $G_2$ resulting from $R_1, R_2, S_1, S_2$ in FIGS. 4, 6 and 7 where n=2), hysteresis can be achieved with only one threshold, $TH_1$ (i.e. m=1 in FIGS. 6 and 7). The gain product ($Gain_i \cdot G_i$) is lower for low signals. As in the case described above, a comparator ($CMP_1$) provides the input to logic unit 50 based on the output of MUX 48 and the threshold ($TH_1$).

Figure 8:
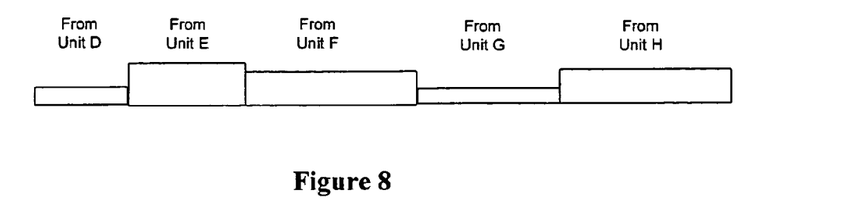
FIG. 8 shows a schematic block diagram of a typical sequence of bursts received at the CO (Central office) in a typical point-to-multipoint topology.

FIG. 8 shows a schematic block diagram of a typical sequence of bursts received at the CO (Central Office) in a typical point-to-multipoint topology. The height of each burst is proportional to its power. The difference in power is caused by the fact that each unit can be located at a different distance from the CO. Each burst carries data signals (which are not shown in the figure). The received signal from Unit G is a low-power burst and is followed by a high-power burst from Unit H.

Figure 9:
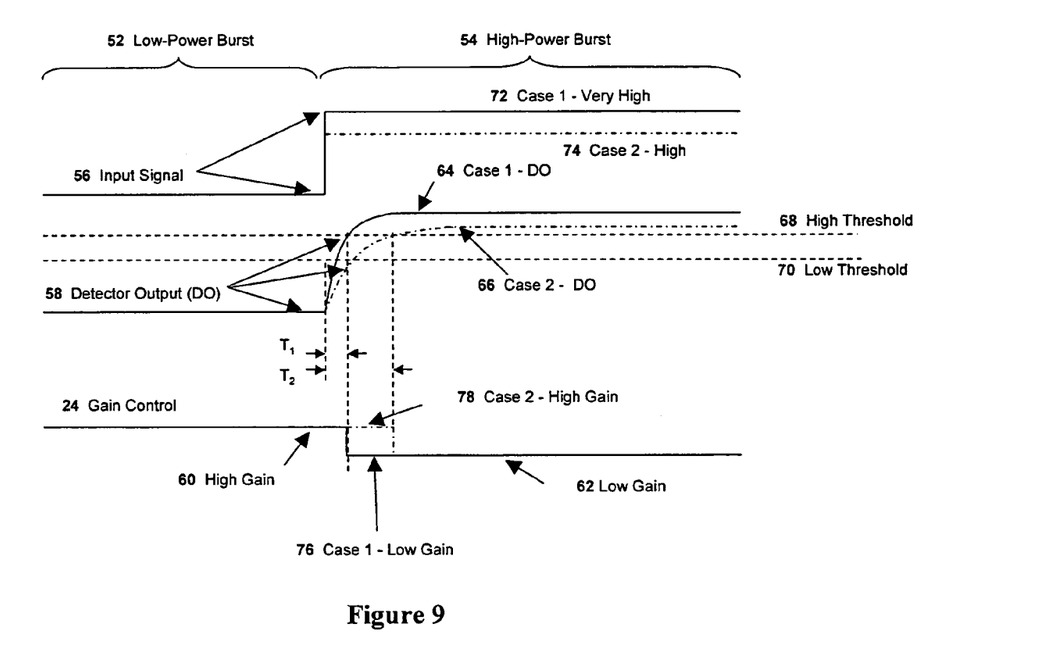
FIG. 9 shows a schematic diagram of an operational problem that can occur with a typical TIA.

FIG. 9 shows a schematic diagram of an operational problem that can occur with a typical TIA when a sequence of bursts as depicted in FIG. 8 (i.e. signal from Unit G followed by Unit H) are received. An operational problem arises when an input signal 56 comprising a high-power burst 54 follows a low-power burst 52. Since the first burst (52) is low-power, gain control 24 chooses a high gain 60 (i.e. first burst level (52) is lower than a low threshold 70). When the second burst (54) starts, gain control 24 attempts to choose a low gain 62 (i.e. second burst level (54) is higher than a high threshold 68).

Because of the finite bandwidth of a detector, a detector output (DO) 58 crosses high threshold 68 (Case 1—DO 64, and Case 2—DO 66), after a finite period of time ($T_1$ and $T_2$, respectively). In the first case, input signal 56 is a Case 1—Very High 72. The output of the detector, Case 1—DO 64, is much higher than high threshold 68; and therefore, the output reaches high threshold 68 within $T_1$ seconds (which is faster than in the second case). In the second case, input signal 56 is a Case 2—High 74 (which is close to the level of high threshold 68). The output of the detector, Case 2—DO 68, is higher than the high threshold 68, but lower than Case 1—DO 64, and therefore reaches high threshold 68 slower (within $T_2$ seconds).

The closer detector output 58 of low-power burst 52 is to low threshold 70 and the closer detector output (Case 1—DO 66) of high-power burst 54 is to high threshold 68, the longer the period of time (i.e. from $T_1$ to $T_2$) it takes to switch from high gain to low gain. This can result in unwanted occurrences of the gain changing in the middle of a burst, and a distortion of an output signal (e.g. Case 1—DO 64 and Case 2—DO 66). A similar problem can occur if a low-power burst follows a high-power burst as well.

Figure 10:
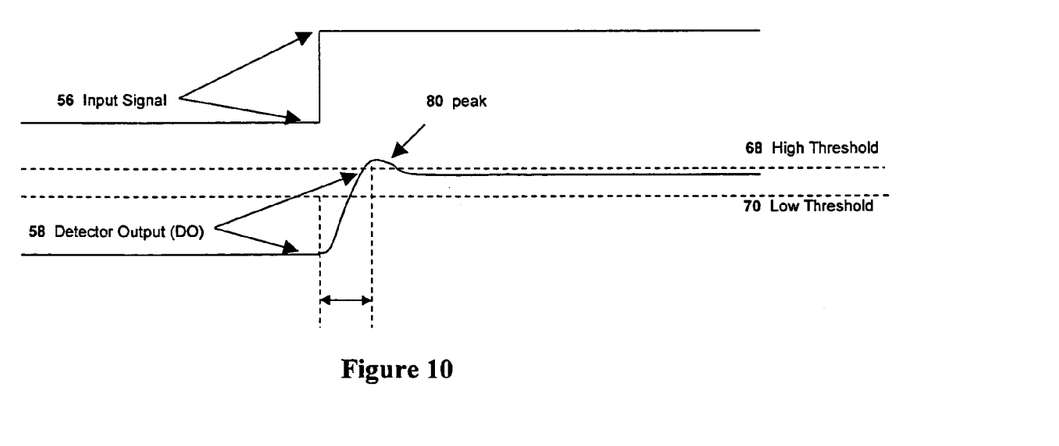
FIG. 10 shows a schematic diagram of a solution to an operational problem that can occur with a typical TIA.

FIG. 10 shows a schematic diagram of a solution to an operational problem that can occur with a typical TIA. Detector output 58 should be as it is depicted in FIG. 10. Filtering detector output 58, as in FIG. 10, generates a peak 80 which will quickly cross high threshold 68 and force a change in gain. Such filtering is achieved by using an undamped response control. One way of achieving such response control is by using a two-pole low-pass filter with the following response function:

$$H(s) = \frac{as + b}{\xi^2 + 2\xi\omega_n s + s^2},$$

where $\xi$ is the damping factor, $\omega_n$ is the natural frequency, a and b are constants, s is an arbitrary complex variable, and H(s) is the Laplace transform of the detector response, which is defined as follows:

$$H(s) = \int_0^\infty e^{-st} h(t) dt,$$

where h(t) is the impule response of the filter. The lower $\xi$ is (e.g. $\xi < 0.7$), the higher peak 80 is in FIG. 10.

All publications, patents, and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

While the present invention has been described with respect to a limited number of embodiments, it will be appreciated that many variations, modifications, and other applications of the present invention may be made.

What is claimed is:

1. A Trans-Impedance Amplifier (TIA) for processing signals, the TIA comprising:
   (a) a TIA core for providing an appropriate gain to a detector output signal;
   (b) a coupler for transferring a part of a TIA output signal without introducing distortion or noise;
   (c) a power detector for obtaining a desired signal level from said signal part provided by said coupler;
   (d) a feedback circuit operative on a gain selector for choosing said appropriate gain internally based on said desired signal level from said power detector;
   (e) a gain control for setting said appropriate gain obtained from said gain selector; and
   (f) a freeze function circuit for controlling said gain selector.

2. The TIA of claim 1, wherein said power detector includes a low-pass filter for filtering said signal part provided by said coupler.

3. The TIA of claim 2, wherein said power detector includes a peak detector for detecting and measuring a peak of said signal part provided by said coupler.

4. The TIA of claim 2, wherein said power detector includes an envelope detector for detecting and measuring an envelope of said signal part provided by said coupler.

5. The TIA of claim 1, wherein said gain selector includes a multiplexer for selecting an input signal based on said desired signal level from said power detector.

6. The TIA of claim 5, wherein said gain selector includes a logic unit for selecting a gain, by said feedback circuit, for both said TIA core and said input signal of said multiplexer.

7. The TIA of claim 1, wherein said TIA core includes a high-gain amplifier and at least one feedback resistor for setting said appropriate gain.

8. The TIA of claim 7, wherein said TIA core further includes at least one switch for engaging or disengaging said feedback resistor.

9. The TIA of claim 1, wherein the TIA operates in a burst mode.

10. The TIA of claim 1, wherein said freeze function circuit is operative to maintain a current gain of said gain selector.

11. The TIA of claim 1, wherein said freeze function circuit includes an interface for remotely activating or deactivating said freeze function circuit.

12. The TIA of claim 6, wherein said freeze function circuit is operative to override said logic unit.

13. A Trans-Impedance Amplifier (TIA) for processing signals comprising:
(a) a TIA core for providing an appropriate gain to a detector output signal;
(b) a coupler for transferring a part of a TIA output signal without introducing distortion or noise;
(c) a power detector for obtaining a desired signal level from said signal part provided by said coupler;
(d) a feedback circuit operative on a gain selector for choosing said appropriate gain internally based on said desired signal level from said power detector; and
(e) a gain control for setting said appropriate gain obtained from said gain selector; and
(f) a freeze function circuit for controlling said gain selector.

14. The TIA of claim 13, wherein said freeze function circuit is operative to maintain a current gain of said gain selector.

15. The TIA of claim 13, wherein said freeze function circuit includes a interface for remotely activating or deactivating said freeze function circuit.

16. The TIA of claim 13, wherein said power detector includes a low-pass filter for filtering said signal part provided by said coupler.

17. The TIA of claim 13, wherein said power detector includes a peak detector for detecting and measuring a peak of said signal part provided by said coupler.

18. The TIA of claim 13, wherein said power detector includes an envelope detector for detecting and measuring an envelope of said signal part provided by said coupler.

19. The TIA of claim 13, wherein said gain selector includes a multiplexer for selecting an input signal based on said desired signal level from said power detector.

20. The TIA of claim 19, wherein said gain selector includes a logic unit for selecting a gain, by said feedback circuit, for both said TIA core and said input signal of said multiplexer.

21. The TIA of claim 20, wherein said freeze function circuit is operative to override said logic unit.

22. The TIA of claim 13, wherein said TIA core includes a high-gain amplifier and at least one feedback resistor for setting said appropriate gain.

23. The TIA of claim 22, wherein said TIA core further includes at least one switch for engaging or disengaging said feedback resistor.

24. The TIA of claim 13, wherein the TIA operates in a burst mode.

25. A method for processing a signal using a Trans-Impedance Amplifier (TIA), comprising the steps of:
(a) obtaining a pre-processed signal from a power detector at an input of the TIA;
(b) using a gain selector of the TIA to choose an appropriate nominal gain $Gain_i$;
(c) setting a nominal input gain $G_i$ to a multiplexer of the TIA;
(d) controlling values of each said $Gain_i$ and each said $G_i$ through a mathematical relation of said $Gain_i$ to said $G_i$; and
(e) regulating said gain selector via a freeze function circuit by maintaining a current gain when said freeze function circuit is activated, thereby providing a desired processing of the signal.

26. The method of claim 25, wherein said step of controlling values of each said $Gain_i$ and each said $G_i$ through a mathematical relation of said $Gain_i$ to said $G_i$ includes prescribing a product of said $Gain_i$ and said $G_i$ to equal a constant.

27. The method of claim 25, wherein said step of controlling values of each said $Gain_i$ and each said $G_i$ through a mathematical relation of said $Gain_i$ to said $G_i$ includes prescribing a product of said $Gain_i$ and $G$, to equal an i-dependent nominal constant.

28. The method of claim 25, performable by the TIA operating in a burst mode.

29. A method for processing signals using a Trans-Impedance Amplifier (TIA), comprising the steps of:
(a) providing a consecutive pair of burst signals from a detector output, said consecutive signals having substantially different power levels;
(b) filtering each said burst signal with a filter, having an under-damped impulse response function to provide an output signal with an appropriate gain amplification; and
(c) using said output signal to obtain an accurate signal peak for each said burst signal, thereby providing a desired processing of said burst signals.

30. The method of claim 29, wherein said step of filtering includes filtering each said burst signal using a two-pole low-pass filter with a specific response function as follows:

$$H(s) = \frac{as+b}{\xi^2 + 2\xi\omega_n s + s^2},$$

where $\xi$ is the damping factor, $\omega_n$ is the natural frequency, a and b are constants, s is an arbitrary complex variable, and H(s) is the Laplace transform of the response of said detector, which is defined as follows:

$$H(s) = \int_0^\infty e^{-st} h(t) dt,$$

where h(t) is the impule response of said filter.

* * * * *